US012630941B2

(12) United States Patent
Haven et al.

(10) Patent No.: US 12,630,941 B2
(45) Date of Patent: May 19, 2026

(54) APPARATUS AND METHOD FOR GROWTH OF GALLIUM OXIDE CRYSTAL WITH AN OFFCUT

(71) Applicant: Luxium Solutions, LLC, Hiram, OH (US)

(72) Inventors: Drew T. Haven, Milford, NH (US); David B. Joyce, Brookline, NH (US); John M. Frank, Akron, OH (US)

(73) Assignee: LUXIUM SOLUTIONS, LLC, Hiram, OH (US)

( * ) Notice: Subject to any disclaimer, the term of this patent is extended or adjusted under 35 U.S.C. 154(b) by 0 days.

(21) Appl. No.: 19/223,587

(22) Filed: May 30, 2025

(65) Prior Publication Data

US 2025/0369152 A1    Dec. 4, 2025

Related U.S. Application Data

(60) Provisional application No. 63/654,768, filed on May 31, 2024.

(51) Int. Cl.
| | |
|---|---|
| *C30B 15/36* | (2006.01) |
| *C01G 15/00* | (2006.01) |
| *C30B 15/04* | (2006.01) |
| *C30B 15/30* | (2006.01) |
| *C30B 15/34* | (2006.01) |
| *C30B 29/16* | (2006.01) |

(52) U.S. Cl.
CPC .............. *C30B 15/36* (2013.01); *C01G 15/00* (2013.01); *C30B 15/04* (2013.01); *C30B 15/30* (2013.01); *C30B 15/34* (2013.01); *C30B 29/16* (2013.01)

(58) Field of Classification Search
CPC ......... C30B 15/34; C30B 29/16; C30B 15/04; C30B 15/36; C30B 29/64
See application file for complete search history.

(56) References Cited

U.S. PATENT DOCUMENTS

| | | | |
|---|---|---|---|
| 7,595,492 | B2 | 9/2009 | Nakamura et al. |
| 9,431,489 | B2 | 8/2016 | Koshi et al. |
| 9,685,515 | B2 | 6/2017 | Sasaki |
| 10,249,767 | B2 | 4/2019 | Sasaki et al. |
| 10,854,776 | B1 | 12/2020 | Raring et al. |

(Continued)

FOREIGN PATENT DOCUMENTS

| | | |
|---|---|---|
| CA | 2517024 C | 12/2009 |
| CN | 104372408 A | 2/2015 |

(Continued)

OTHER PUBLICATIONS

English computer translation of CN-117187947-A (Year: 2025).*

(Continued)

*Primary Examiner* — Matthew J Song
(74) *Attorney, Agent, or Firm* — Abel Schillinger, LLP; John M. Frank

(57) ABSTRACT

Apparatuses and methods as described herein can be used to grow a $Ga_2O_3$ based single crystal using an Edge-defined film fed growth (EFG) method. The single gallium oxide crystal sheet can have a principal plane is offcut from a (100) crystallographic orientation. In one embodiment, the offcut is between 2 and 20 degrees. The single crystal can have a full width half mass of less than 50 arcsec.

15 Claims, 3 Drawing Sheets

Pull Direction <010>

Crystal Growth Direction (100) Plane

Die

(56) References Cited

U.S. PATENT DOCUMENTS

| | | | | |
|---|---|---|---|---|
| 10,861,945 | B2 | 12/2020 | Sasaki et al. | |
| 11,028,501 | B2 | 6/2021 | Galazka et al. | |
| 2015/0249185 | A1 | 9/2015 | Koshi et al. | |
| 2015/0380500 | A1* | 12/2015 | Masui | H10D 62/40 |
| | | | | 252/512 |
| 2017/0233892 | A1 | 8/2017 | Sasaki | |
| 2020/0194560 | A1 | 6/2020 | Takizawa et al. | |
| 2021/0017668 | A1* | 1/2021 | Kawasaki | C30B 29/64 |
| 2022/0028700 | A1 | 1/2022 | Hirabayashi | |
| 2024/0011192 | A1* | 1/2024 | Nishiguchi | C30B 29/16 |

FOREIGN PATENT DOCUMENTS

| | | | | | |
|---|---|---|---|---|---|
| CN | 107177885 | B | | 10/2019 | |
| CN | 111850685 | A | | 10/2020 | |
| CN | 112981522 | A | | 6/2021 | |
| CN | 117187947 | A | * | 12/2023 | C30B 15/36 |
| EP | 2765612 | B1 | | 10/2021 | |
| JP | 2011153054 | A | | 8/2011 | |
| JP | 2013103863 | A | | 5/2013 | |
| JP | 2016013929 | A | | 1/2016 | |
| JP | 2018076193 | A | | 5/2018 | |
| WO | 2022202747 | A1 | | 9/2022 | |
| WO | 2025250905 | A1 | | 12/2025 | |
| WO | 2025250928 | A1 | | 12/2025 | |

OTHER PUBLICATIONS

Mazzolini et al., "Offcut-related step-flow and growth rate enhancement during (100) β-Ga2O3 homoepitaxy by metal-exchange catalyzed molecular beam epitaxy (MEXCAT-MBE)", Appl. Phys. Lett. 117, 222105 (2020); https://doi.org/10.1063/5.0031300.

Galazka et al., "Two inch diameter, highly conducting bulk β-Ga2O3 single crystals grown by the Czochralski method", Appl. Phys. Lett. 120, 152101 (2022), https://doi.org/10.1063/5.0086996.

Li et al., "Investigation of the crack extending downward along the seed of the β-Ga2O3 crystal grown by the EFG method", CrystEngComm, 2021, 23, 6300, https://doi.org/10.1039/d1ce00576f.

International Search Report and Written Opinion for PCT/US2025/031598, mailed Sep. 26, 2025, 10 pages.

International Search Report and Written Opinion for PCT/US2025/031636, mailed Sep. 24, 2025, 10 pages.

Kuramata et al., "High-quality β-Ga2O3 single cyrstals grown by edge-defined film-fed growth", published Nov. 15, 2016, Jpn. J. Appl. Phys. 55 1202A2, DOI: 10.7567/JJAP.55.1202A2.

Li et al., "The Spatial Correlation and Anisotropy of β-(AlxGal•x)2O3 Single Crystal", published Jun. 8, 2023, Materials 2023, 16, 4269, DOI: 10.3390/ma16124269.

Zhang et al., "Growth and characterization of 2-inch high quality β-Ga2O3 single crystals grown by EFG method", Journal of Semiconductors, Aug. 2018, vol. 39, No. 8, DOI: 10.1088/1674-4926/39/8/083003.

Feng et al., "2 in. Bulk β-Ga2O3 Single Crystals Grown by EFG Method with High Wafer-Scale Quality", ACS Omega, 2024, 9, 22084-22089, DOI: 10.1021/acsomega.4c00405.

Mazzolini, P. et al, "Substrate-orientation dependence of β-Ga2O3 (100), (010), (001), and (201) homoepitaxy by indium-mediated metal-exchange catalyzed molecular beam epitaxy (MEXCAT-MBE)", APL Materials, published online: Jan. 10, 2020, vol. 8, pp. 1-10.

Nakagomi, Shinji et al., "Crystal orientation of β-Ga2O3 thin films formed on c-plane and a-plane sapphire substrate", Journal of Crystal Growth, published online: Apr. 17, 2012, vol. 349, pp. 12-18.

* cited by examiner

APPARATUS AND METHOD FOR GROWTH OF GALLIUM OXIDE CRYSTAL WITH AN OFFCUT

CROSS-REFERENCE TO RELATED APPLICATION(S)

This Application claims priority under 35 U.S.C. § 119(e) to U.S. Provisional Patent Application No. 63/654,768 entitled "APPARATUS AND METHOD FOR GROWTH OF GALLIUM OXIDE CRYSTAL WITH AN OFFCUT," filed May 31, 2024, by Drew T. HAVEN et al., which is assigned to the current assignee hereof and is incorporated herein by reference in its entirety.

FIELD OF DISCLOSURE

The present disclosure is directed generally to single crystal components and particularly to single crystal sheets, methods for forming such sheets, and processing equipment used in connection with the formation of single crystal sheets.

BACKGROUND

Single crystals such as gallium oxide, and in particular $\beta$-$Ga_2O_3$, have gained interest and become more demanding for high performance optical applications. Single crystal gallium oxide possesses good optical properties and desirable mechanical characteristics—such as extreme hardness, strength, erosion resistance, and chemical stability in harsh environments—making the ultra-wide bandgap semiconductor deal for optoelectronic applications.

While certain applications have taken advantage of columnar single crystal gallium oxide crystals, its implementation has not been widespread partly due to cost and size limitations due to forming technologies. To date, the industry has focused on growing gallium oxide in a certain pull direction and then slicing the crystal in a different orientation or direction to obtain the desired crystal orientation. In this regard, single crystal gallium oxide in the form of sheets, and in particular in the principal phase, is one geometric configuration that holds much industrial promise, but of which has been increasingly difficult to produce. Scaling size while controlling processing costs and reducing polycrystalline twinning has been a challenge in the industry. For example, repeatable production of large-sized sheets of gallium oxide have not been developed for reliable manufacturing. In particular, repeatable preparation of gallium oxide single crystals having a high quality and large diameter at a low cost by using an edge-defined film-fed growth (EFG) method have not been developed. Therefore, further improvements in apparatuses and methods of growing large-sized gallium oxide sheets are desired.

BRIEF DESCRIPTION OF THE DRAWINGS

The present disclosure may be better understood, and its numerous features and advantages made apparent to those skilled in the art by referencing the accompanying drawings. Embodiments are illustrated by way of example and are not limited in the accompanying figures.

Figure 1:
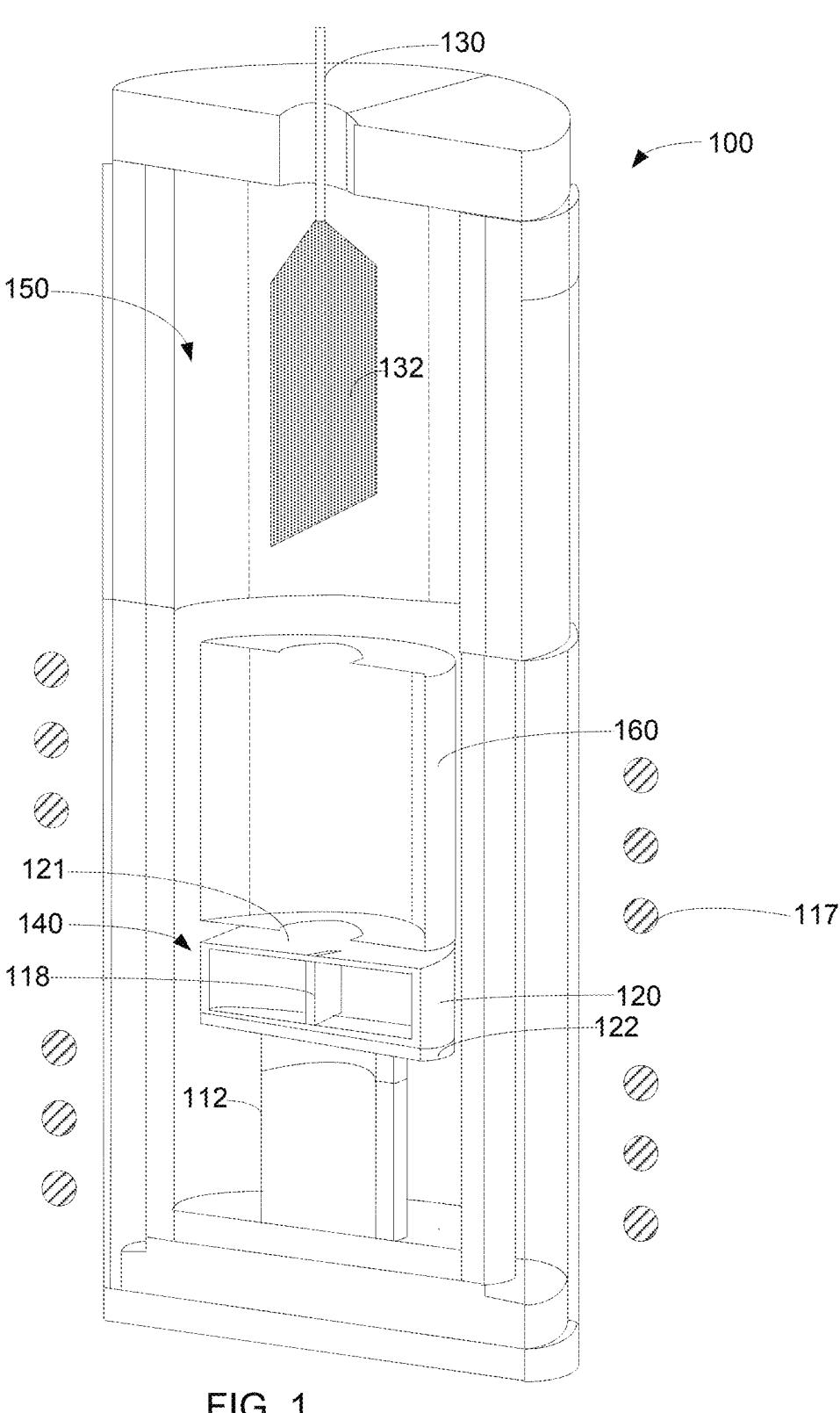
FIG. 1 includes a schematic view of a crystal growth apparatus, according to one embodiment of the present disclosure.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. According to various embodiments, new gallium oxide single crystals, crystal growth apparatus, particularly, an EFG growth apparatus, and methods for growing single crystal sheets are provided.

The foregoing has outlined rather broadly and in a non-limiting fashion the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the scope of the invention as set forth in the appended claims.

As used herein, the terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about," "approximately," or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Group numbers corresponding to columns within the Periodic Table of Elements based on the IUPAC Periodic Table of Elements, version dated Nov. 28, 2016.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the scintillation, radiation detection and ranging arts.

Apparatuses and methods as described herein can be used to grow gallium oxide sheets whose principal plane is offcut from a (100) crystallographic orientation utilizing an EFG growth method, where the crystal has a full width half mass (FWHM) of less than 50 arcsec. Gallium oxide has poor thermal conductivity that leads to cleaving and facets and thus limits the size of growth to less than 1 square inch for EFG. However, according to various embodiments of the present disclosure, new gallium oxide single crystals, a crystal growth apparatus, particularly, an EFG growth apparatus, and methods for growing single crystals are provided.

Description of these various embodiments begins with a discussion of the EFG growth apparatus 100 illustrated in FIGS. 1 and 2. As used herein, the term EFG refers to the Edge-Defined-Film-Fed Growth technique, a technique that is generally understood in the industry of single crystal fabrication and particularly includes EFG as applied to gallium oxide single crystal growth.

The EFG growth apparatus 100 includes several main components, including a pedestal 112 supporting melt fixture 140, which is open to and communicates with afterheater 160. Pedestal 112 is generally provided to mechanically support the apparatus while thermally isolating the melt fixture 140 from the work surface on which the EFG apparatus is provided, to attenuate heat transmission from the melt fixture 140 to the work surface. In this context, the pedestal 112 is generally formed of a refractory material capable of withstanding elevated temperatures on the order of 2,000° C. While various refractory metals and ceramics may be utilized, zirconia is particularly suited for the pedestal 112. In one embodiment, vent holes can be provided in pedestal 112 to further improve thermal isolation.

Turning to melt fixture 140, crucible 120 is provided for containing the melt that is utilized as the raw material for forming the single crystal. In the context of gallium oxide single crystals, the raw material is a melt from β-gallium oxide material. The crucible 120 is typically formed of a refractory metal that is adapted to be heated through exposure to the field generated by an inductive heating element 117. The crucible is desirably formed of iridium although other materials may be utilized such as tungsten, tantalum, platinum, nickel, and in the case of growth of silicon single crystals, graphite. More generally speaking, the materials are desired to have a higher melting point than the crystal being drawn, should be wet by the melt, and not react chemically with the melt. The inductive heating element 117 can be an RF coil, having multiple turns forming a helix. Within the crucible 120, a die 118 is provided, which extends into the depth of the crucible, the die 118 having a center channel that is open through a crucible lid and generally exposed to afterheater 160 (described in more detail below). The lid helps to prevent the melt from evaporating from the crucible 120. The die 118 is alternatively referred to as a "shaper" in the art.

Further, the melt fixture 140 is generally mechanically supported by a support plate 122 overlying pedestal 112. In one embodiment, thermal insulation can be provided by bottom insulation between the crucible 118 and the support plate 122 as well as insulation layers generally surrounding the lateral sides and top of the melt fixture 140. The bottom insulation and the insulation layers may be formed of zirconia oxide or alumina oxide insulating materials, for example, although other insulation materials may be utilized such as low conductivity other materials are, when thermodynamically compatible, alumina felt and insulating materials; zirconia felt and insulation; aluminum nitride, and fused silica (quartz).

The melt fixture 140 can be between the pedestal 112 and the afterheater 160. The melt fixture 140 includes crucible 120 supported by support plate 122. The crucible 120 is closed off by crucible lid 121. According to one embodiment, the crucible 120 can have an elongated structure, that is, has a structure in which the horizontal cross section is not circular. The crucible 120 can have a length l, a width w, and a depth d, wherein an aspect ratio defined as l:w is not less than 2:1. In another embodiment, the aspect ratio is not less than 3:1, such as not less than 4:1. While the cross-sectional shape of the crucible 120 can be oval, other embodiments may be rectangular or polygonal, while still maintaining the foregoing aspect ratio features. The inductive heating element 117 shown in FIGS. 1 and 2 also has an aspect ratio similar to that of the crucible 120, namely being greater than 2:1.

The afterheater 160 can have two openings on either side that facilitate the growth of the crystal. In a particular embodiment the openings can be within the top and bottom of the afterheater 160. The afterheater 160 provides a temperature control area to further aid in the growth of the crystal. The afterheater 160 maintains a thermal control gradient and protection from the external environment. In one embodiment, the temperature within the afterheater 160 is between 1000° C. to about 2000° C.

While a more detailed discussion is provided below regarding the growth process and operation of the EFG growth apparatus, the process generally calls for aligning the seed so that the target growth face is parallel to the die 118 and lowering a seed crystal 130 through the afterheater 160 to make contact with the liquid that is present at the top of the die 118, exposed through the crucible lid and to the afterheater 160. The seed crystal 130 is then rotated clockwise or counterclockwise to the desired degree of rotation. In one embodiment, the degree of rotation will match the desired miscut of the final wafer and will result in a grown in misscut into the wafer or ribbon. In one embodiment, the degree of rotation is greater than 0.2 degrees, such as greater than 1 degree, such as greater than 2 degrees, or greater than 3 degrees. In one embodiment, the degree of rotation is less than 25 degrees, such as less than 22 degrees, or less than 20 degrees. In one embodiment, the degree of rotation is between 2 and 20 degrees.

In the embodiment illustrated, the afterheater is passive, that is, does not contain active heating elements. However, the after heater may be active, incorporating temperature control elements such as heating elements. After initial growth, the seed crystal is raised and the growing single crystal 132 spreads to form a neck portion, having a growing width but which is less than the length of the die. The neck portion spreads to full width, initiating the growth of the full width portion or main body of the single crystal. The width can be greater than 25 mm, such as greater than 30 mm, or 40 mm and less than 153 mm, such as less than 140 mm, or 114 mm. The single crystal is then raised through the afterheater 160 and into upper heating zone 150. The upper heating zone 150 provides a controlled cooling environment and in turn a controlled cooling rate for the single crystal 132. As the single crystal 132 translates into the upper heating zone 150, the single crystal 132 enters into a second thermal environment different from the thermal environment within the afterheater 160. In essence, the controlled thermal gradient difference as the single crystal goes from the die 118, through the afterheater 160 and into the upper heating zone prevents catastrophic failure of crystal 132 during cooling.

Focusing further on operation of the EFG growth apparatus 100, typically crystal growth begins with formation of a melt in the crucible. Here, the crucible is filled with a feed material doped gallium oxide. The feed material is generally provided by introduction through feed tubes, not shown. In one embodiment, the feed tubes aid in eliminating gallium oxide losses through evaporation and keep the crucible seal intact. The melt is initiated and maintained by inductive heating at a temperature of about 1700° C. to about 2200° C., by energizing inductive heating element 117 having a plurality of inductive heating coils. Heating by induction is effected by heating of the crucible 120, transmitting thermal energy into the material contained therein. The melt wets the die 118, forming a layer of liquid at the surface of the die.

After formation of a stable melt in the crucible, the seed crystal 130 is lowered through the afterheater 160, to contact the liquid at the die opening. After contact of the seed crystal with the melt at the die opening, the liquid film of the melt extending from the die to the seed is observed and temperature and temperature gradient (discussed below) are adjusted to reach a film height, such as on the order of 0.3 to 2.0 millimeters. At this point, the seed crystal is slowly raised such that upon raising the crystal into the lower compartment of the afterheater 160 the lower temperature causes crystallization of the liquid melt, forming a single crystal. The seed crystal is generally raised within a range of about 1 to 100 millimeters per hour, such as within a range of 3 to 40 millimeters per hour or 5 to 20 millimeters per hour. The seed crystal 130 is then rotated clockwise or counterclockwise to the desired degree of rotation. In one embodiment, the degree of rotation will match the desired miscut of the final wafer and will result in a grown in miscut into the wafer or ribbon. In one embodiment, the degree of rotation is greater than 1 degree, such as greater than 2 degrees, or greater than 3 degrees. In one embodiment, the degree of rotation is less than 25 degrees, such as less than 22 degrees, or less than 20 degrees. In one embodiment, the degree of rotation is between 2 and 20 degrees.

Figures 2A, 2B:
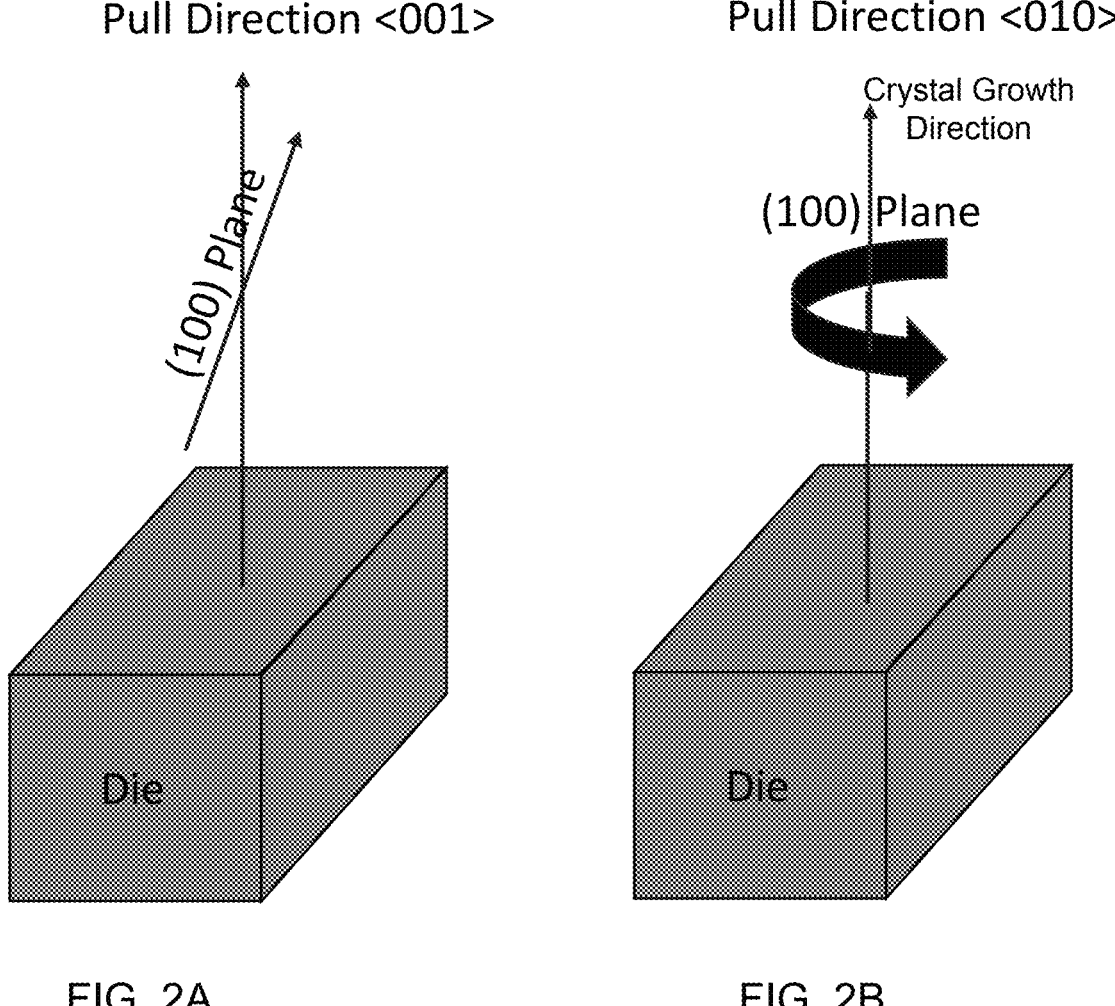
FIGS. 2A and 2B each include an illustration of growth of the crystal utilizing the apparatus of FIG. 1.

As seen in FIGS. 2A and 2B, rotation of the shaft can occur perpendicular to the pull direction, as seen in FIG. 2B, or an axial rotation as seen in FIG. 2A. The resultant orientation for the produced ribbon will be different. In one embodiment, when the rotation is a degree of rotation about the die or tilting of the <001>-axis, as seen in FIG. 2A, the resultant crystal can facet. When the degree of rotation is about the pull direction-in other words, a rotation about the <010>-axis that causes the (100) plane to rotate away from parallel with the die, as seen in FIG. 2B, the resultant orientation in the final wafer can be (100) with a miscut, as desired. As will further be exemplified below, the rotation in FIG. 2B can be used for growing a single gallium oxide crystal whose principal plane is offcut from the (100) crystallographic orientation by between 2 and 20 degrees.

At this point in the crystal growing process, a neck is grown, representing a sub-maximum width of the single crystal. Turning briefly to the full-length single crystal 300 shown in FIG. 3, the single crystal 300 includes a main body 302 and a spread 304, wherein the transition from the spread to the main body is labeled T. The initial portion of the neck extending from the distal end is desired to have a minimum geometry, such as on the order of a few centimeters long, and having a thickness corresponding to at least one half the width of the die. In one embodiment, the resultant grown crystal is offcut from the (100) crystallographic orientation by between 2 and 20 degrees. In other words, the resultant crystal can have a grown in miss-cut of greater than 2 degrees. Once assuring that the initial growth of the neck is desirable, the balance of the neck is grown by lowering the pull speed to be on the order of 0.1 cm/hr to about 20 cm/hr, oftentimes within a range of about 0.1 cm/hr to about 10 cm/hr, more particularly, 0.5 cm/hr to 5 cm/hr. The temperature may be lowered to be on the order of 10° C. to 100° C. lower, such as 10° C. to 50° C. lower than the initial starting temperature of the process. Additionally, while pulling the crystal, the principal offcut is maintained.

Figure 3:
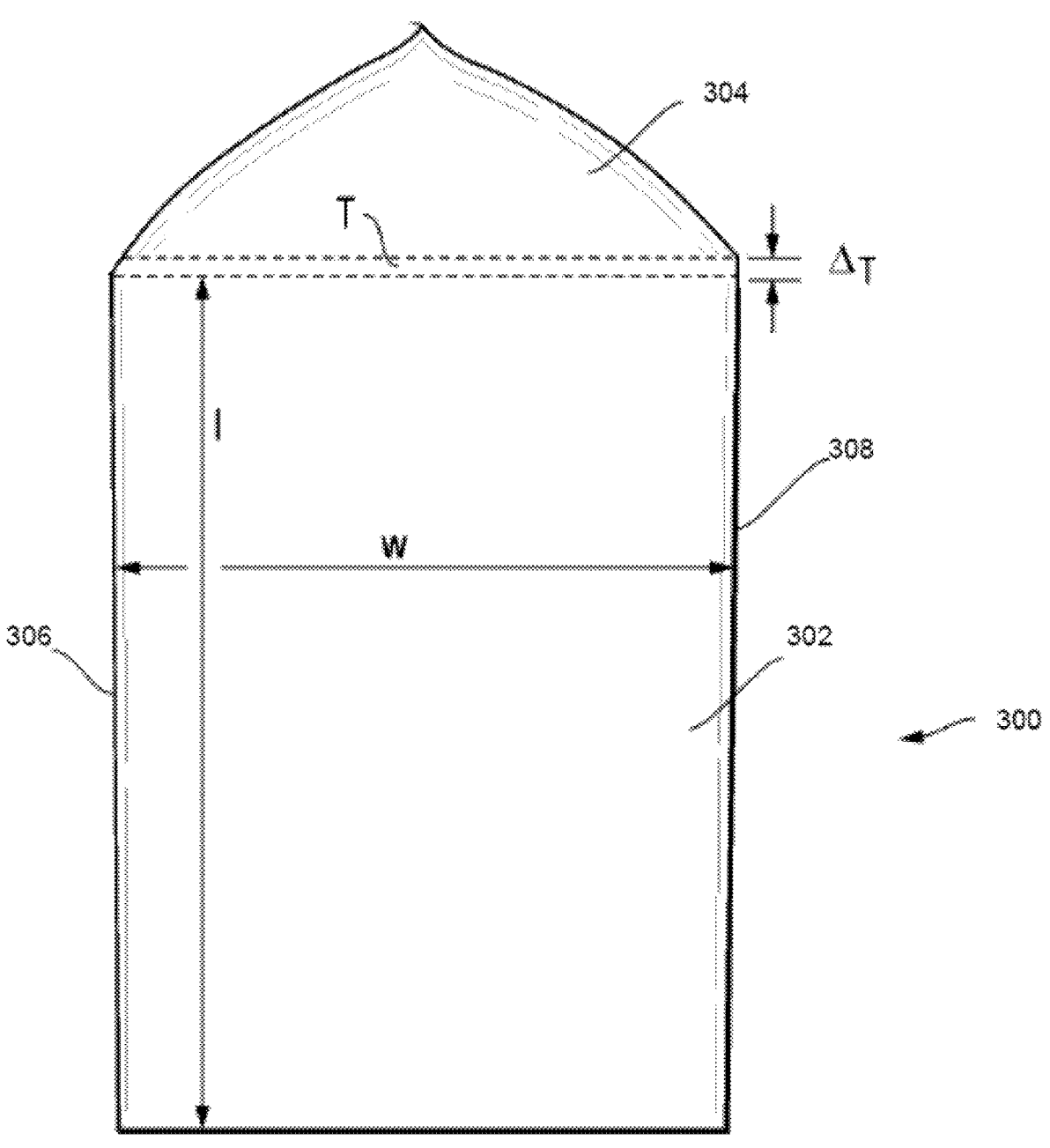
FIG. 3 includes an illustration of a perspective view of a gallium oxide sheet, according to one embodiment.

Upon continued pulling of the seed crystal 130, the neck widens to maximum width, which is the length of the die 118. Turning briefly to FIG. 3, an illustration of a grown β-Ga$_2$O$_3$ crystal 300 grown offcut from a (100) crystallographic orientation is provided. The crystal 300 represents an as-formed full-length crystal that was acceptable for further processing into useful components. Growth of large, greater than 2 square inch, gallium oxide crystals is historically difficult and problematic as gallium oxide has strong electrical, optical, and thermal anisotropy due to its monoclinic crystal structure, is a poor thermal conductor, and is prone to cleaving and faceting. The thermal stresses are one of the limiting factors, prohibiting defect-free crystal growth greater than 2 square inches.

The unique properties of gallium oxide thus present issues for scaling up boules to large size, i.e. larger than 2 squared inches. The larger the desired crystal, the more opportunity for such changes in plane orientation and the more difficult to grow a sheet of single orientation substrates. As such, growth of a β-gallium oxide crystal of greater than 2 square inches, grown offcut from the (100) orientation using EFG, as seen in FIG. 3, is unique and unexpected.

Crystal 300 includes a main body 302 and a spread 304, wherein the transition from the neck to the main body during growth happens along transition zone T as labeled. As shown, the main body 302 includes first and second opposite lateral sides 306, 308 that are generally parallel to each other, wherein the end point of each of the sides 306 and 308 is defined by respective lateral transitions from the spread 304 to the main body 302, representing full width.

Precise growth environment control minimizes melt decomposition and reduces the volatility of gallium suboxides that could lead to an unsuccessful crystalline growth. The overall temperature profile along the length of the die is generally such that the center of the die has the highest temperature, with temperature falling off to the edges of the die. Ideally, the curve is symmetrical, where temperature from the center to each end of the die falls off uniformly, creating generally similar temperature gradients from the center of the die to each end of the die. Noteworthy, the material of the afterheater is chosen to provide the desired temperature profile. As such, the shields, acting as heating elements are typically symmetrical about an axis bisecting the die, and have a height that is at its maximum at the center of the die, gradually decreasing to a minimum at opposite ends of the die. In one embodiment, dynamic adjustment of the thermal gradient is carried out after the formation of the melt in the crucible. Still further, the thermal gradient may be adjusted during the growth of the single crystal, that is, during the pulling of the seed crystal so as to grow and draw the single crystal.

Upon the creation of a full-length single crystal that is greater than 2 square inches grown with an offcut from the (100) orientation, the single crystal is broken free from the melt by pulling, and temperature is stabilized by maintaining the single crystal within the heating zone 150. Thereafter, the single crystal is pulled to enter the afterheater 160 and then heating zone 150, during which a controlled cooling of the crystal is affected. Typically, cooling is carried out at a rate not greater than about 300° C./hr, such as not greater than about 200, 150, or even 100° C./hr. According to an embodiment, the cooling rate is not less than about 50° C./hr., such as within a range of about 50 to 100° C./hr. The relatively slow cooling rates are generally dictated by several parameters, including the mass of the crystal. Here, in the case of relatively large single crystals, it is not uncommon that the single crystal to have a mass greater than about 0.010 Kg, such as greater than about 0.05 Kg, or 0.5 Kg, or 1.5 Kg, or 2 Kg.

Following the growth, separation and cool down of the single crystal, machining operations typically follow. It is generally desired that the single crystal be near-net shape, but oftentimes machining is performed to shape the single crystal into the desired geometric configurations for commercial use. Accordingly, grinding, lapping, polishing and the like, or bulk material removal/shaping such as wire sawing or cleaving and the like may be utilized to manipulate the single crystal into a desired component or components, such as substrates, LEDS, temperature sensors, high temperature electronics. However, while grinding, lapping, polishing or the like help shape the material, the orientation from the as grown crystal can be within 1-10 degrees. Moreover, since the orientation is as grown, the segregation of dopants is uniform throughout the entire grown sheet. That is to say, the amount of dopant or dopant distribution seen towards the top of the sheet is about equivalent to the amount of dopant seen towards the bottom of the as grown sheet.

Turning to the single crystal itself, as seen in FIG. 3, the single crystal is in the form of beta gallium oxide crystal. In one embodiment, the single crystal may be doped with an element such as Sc, Sn, In, Zr, Cr, Ce, Mn, Fe, Cu, Ag, Cd, Hf, Al, Si, Mg, Ge, or Nb. The principal plane of the $\beta$-$Ga_2O_3$ crystal is offcut from the (100) orientation by between 2 and 20 degrees. In one embodiment, the crystal 300 can have a full width half mass (FWHM) of less than 50 arcsec, such as less than 45 arcsec, or less than 40 arcsec, or less than 35 arcsec. In one embodiment, the crystal 300 can have a FWHM as measured with the beam oriented parallel to the pull direction of less than 50 arcsec, such as less than 45 arcsec, or less than 40 arcsec. In one embodiment, the crystal 300 can have a FWHM as measured with the beam oriented perpendicular to the pull direction of less than 50 arcsec, such as less than 45 arcsec, or less than 40 arcsec, or less than 35 arcsec.

Typically, the single crystal can have a width not less than about 1 cm, such as not less than about 5 cm, or 15 cm, or even 20 cm. The width corresponds to the length of the die during the drawing operation, the die determining the desired maximum width of the crystal. Further, according to a particular feature, the average thickness is not less than about 0.5 mm, such as not less than about 0.6 mm, 0.7 mm, 0.8 mm, or even 0.9 mm and not greater than 25 mm. In one embodiment, the crystal 300 has a length that is greater than 25 mm, such as greater than 50 mm, or 60 mm, or 100 mm and less than 500 mm, such as less than 600 mm, 800 mm, or 1000 mm.

Further, the single crystal typically has a relatively confined variation in thickness, having a variation not greater than about 0.2 mm. Variation thickness is the difference between maximum and minimum thickness values along a segment spanning the width of the sheet.

Here, variation in thickness corresponds to the maximum thickness variation along a segment spanning the width of the main body of the single crystal sheet. Ideally, the maximum thickness variation corresponds to substantially the majority of all width segments along the main body, generally denoting a maximum thickness variation along the majority of main body of the single crystal.

EXAMPLES

Example 1, a crystal having dimensions $55\pm5\times100\pm10\times 2\pm0.5$ (W×L×T in mm). The following process flow was used to form Example 1.
- a. Load crucible with the desired amount of gallium oxide feed material and dopant.
- b. Set up furnace with growth components: crucible, die, shields and insulation package (hotzone).
- c. Align the seed so that the target growth face is parallel to the die, then rotate the seed shaft clockwise or counterclockwise to the desired degree of rotation. This should match the desired miscut of the wafer and will result in growing in the desired miscut into the ribbon.
- d. Purge chamber for 2 hours at 10 scfm with a mixture of Argon and Oxygen.
- e. Turn on 50 kW power supply.
- f. Ramp power to just below the melt point of gallium oxide.
- g. Manually adjust temperature until melting (Tm) is observed.
- h. Allow melt to stabilize for 30 min.
- i. Lower seed and contact die at mid-point.
- j. Adjust temperature so that approximately 1 mm of liquid film separates seed crystal and die (Tn).
- k. Start upward translation of puller to form a neck.
- l. Grow neck of crystal for 15 min and inspect for a uniform cross section. If neck is not uniform, adjust temperature until the cross section becomes uniform and stable.
- m. Adjust temperature to Tn−30° C. and/or pull speed until spreading begins.
- n. Allow crystal to spread to edges of die.
- o. Adjust the temperature to maintain a uniform liquid film height at die interface while growing the body of the crystal.
- p. When full width crystal has reached a length of 100 mm pull the crystal free of die by increasing pull rate to 7500 mm/hr for a length of 8 mm.
- q. Ramp power to zero.

Other Examples

For different size crystals, the amount of raw material fed into the crucible changes to accommodate the different weight of the crystal. For example, the total weight for Example 1 was about 30 g. For a 50×80×2 the total weight will be 60 g. Generally, it is desirable to charge the incoming raw material generally uniformly through the growing process, over the whole length of the crystal. The crystals grown in samples 1-4 were grown using the method outlined above. The resultant FWHM measurements are outlined below in Table 1.

TABLE 1

| Sample Number | (400) FWHM$_\parallel$ [arsec] | (400) FWHM$_\perp$ [arsec] |
|---|---|---|
| 1 | 52.9 | 38.9 |
| 2 | 67.7 | 43.9 |
| 3 | 37.4 | 47.9 |
| 4 | 39.2 | 33.5 |

The principal plane of the $\beta$-Ga$_2$O$_3$ crystal is offcut from the (100) orientation by between 2 and 20 degrees. Sample 1 is offcut by 3.7 degrees, sample 2 is offcut by 3.8 degrees, sample 3 is offcut by 1.05 degrees, and sample 4 is offcut by 3.9 degrees. Sample 1 has a FWHM as measured with the beam oriented parallel to the pull direction of less than 55 arcsec, sample 2 has a FWHM of less than 70 arcsec, sample 3 has a FWHM of less than 40 arcsec, and sample has a FWHM of less than 40 arcsec. Sample 1 has a FWHM as measured with the beam oriented perpendicular to the [010] pull direction of less than 40 arcsec, sample 2 has a FWHM of less than 45 arcsec, sample 3 has a FWHM of less than 50 arcsec, and sample 4 has a FWHM of less than 35 arcsec.

Through use of various features of the embodiments of the present invention, such as utilization of a high aspect ratio crucible, high aspect ratio heating element, use of a gradient trim system, and introduction of a compartmentalized afterheater, gallium oxide single crystal sheets having the foregoing desirable geometric and mass features such as minimum width, thickness, and thickness variation features may be successfully formed. More particularly, use of a high aspect ratio crucible may improve process uniformity and repeatability, which use of a thermal gradient system for dynamically controlling the thermal gradient along the length of the die can be used to minimize the thermal gradient along the die, maximum temperature variations along the die, and accordingly provide for a symmetrical spread along the neck of the single crystal, contributing to thickness uniformity and the ability to grow relatively large mass and relatively thick crystals. While the prior art has reported success in the formation of moderately sized single crystals having limited width and/or thickness, embodiments of the present invention provide for improved process control and equipment enabling next generation, large sized single crystals, and in particular, single crystal sheets.

VARIOUS EMBODIMENTS

Embodiment 1. A Ga$_2$O$_3$ single crystal can include a single gallium oxide crystal sheet whose principal plane is offcut from a (100) crystallographic orientation, where the single crystal has a full width half mass (FWHM) of less than 50 arcsec.

Embodiment 2. The Ga$_2$O$_3$ crystal of embodiment 1, where the FWHM is measured parallel to a pull direction.

Embodiment 3. The Ga$_2$O$_3$ crystal of embodiment 1, where the FWHM is measured perpendicular to the pull direction.

Embodiment 4. The Ga$_2$O$_3$ crystal of embodiment 1, where a grown in miss-cut is greater than 2 degrees.

Embodiment 5. The Ga$_2$O$_3$ crystal of embodiment 4, where the grown in miss-cut is less than 20 degrees.

Embodiment 6. A method of growing a Ga$_2$O$_3$ based single crystal using an Edge-defined film fed growth (EFG) method, can include bringing a seed crystal having a (100)

crystallographic orientation in contact with a Ga$_2$O$_3$ base melt, wherein a growth face is parallel to the base melt; rotate a shaft clockwise or counterclockwise by a degree of rotation, wherein the degree of rotation is greater than 2 degrees and less than 20 degrees; pulling the seed crystal to grow the Ga$_2$O$_3$ based single crystal, wherein the Ga$_2$O$_3$ based single crystal has a (010) crystallographic orientation as it is being grown; and cooling the $\beta$-Ga$_2$O$_3$ based single crystal after it has reached a length that is greater than 40 mm.

Embodiment 7. The method of embodiment 6, where the length of the Ga$_2$O$_3$ based single crystal is greater than 42 mm, 46 mm, 50 mm, 52 mm, 54 mm, or 60 mm and not greater than 1000 mm.

Embodiment 8. The method of embodiment 7, where the length of the Ga$_2$O$_3$ based single crystal is less than 500 mm, or such as less than 800 mm.

Embodiment 9. The method of embodiment 6, where the Ga$_2$O$_3$ based single crystal has a width that is greater than 25 mm, such as greater than 30 mm, 35 mm, 40 mm, or 50 mm.

Embodiment 10. The method of embodiment 9, where the width of the $\beta$-Ga$_2$O$_3$ based single crystal is less than 153 mm, such as less than 140 mm, 127 mm, or 114 mm.

Embodiment 11. The method of embodiment 6, where the Ga$_2$O$_3$ based single crystal has a thickness of not less than about 0.2 mm, such as not less than about 0.8 mm, 0.9 mm, 2 mm, or even 5 mm.

Embodiment 12. The method of embodiment 11, where the $\beta$-Ga$_2$O$_3$ based single crystal has a thickness of not greater than 25 mm.

Embodiment 13. The method of embodiment 6, further can include adding a dopant to the Ga$_2$O$_3$ base melt.

Embodiment 14. The method of embodiment 13, where the dopant comprises a material selected from the group consisting of Sc, Sn, In, Zr, Cr, Ce, Mn, Fe, Cu, Ag, Zn, Cd, Al, Si, Mg, Ge, and Nb.

Embodiment 15. The method of embodiment 14, where the crystal has a dopant distribution that is about the same at a top of the crystal as a bottom of the crystal.

The foregoing embodiments represent a departure from the state-of-the-art. Notably, the embodiments herein include a combination of features not previously recognized in the art and facilitate performance improvements.

The above-disclosed subject matter is to be considered illustrative, and not restrictive, and the appended claims are intended to cover all such modifications, enhancements, and other embodiments, which fall within the true scope of the present invention. Thus, to the maximum extent allowed by law, the scope of the present invention is to be determined by the broadest permissible interpretation of the following claims and their equivalents and shall not be restricted or limited by the foregoing detailed description.

The Abstract of the Disclosure is provided to comply with Patent Law and is submitted with the understanding that it will not be used to interpret or limit the scope or meaning of the claims. In addition, in the foregoing Detailed Description of the Drawings, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all features of any of the disclosed embodiments. Thus, the following claims are incorporated into the Detailed Description of the Drawings, with each claim standing on its own as defining separately claimed subject matter.

What is claimed is:

1. A method of growing a $Ga_2O_3$ based single crystal using an Edge-defined film fed growth (EFG) method, comprising:

bringing a seed crystal having a (100) crystallographic orientation in contact with a $Ga_2O_3$ base melt, wherein a growth face is parallel to the base melt;

rotate a shaft clockwise or counterclockwise about the pull direction by a degree of rotation, wherein the degree of rotation is greater than 2 degrees and less than 20 degrees;

pulling the seed crystal to grow the $Ga_2O_3$ based single crystal, wherein the $Ga_2O_3$ based single crystal has a (010) crystallographic orientation as it is being grown; and cooling the $\beta$-$Ga_2O_3$ based single crystal after it has reached a length that is greater than 40 mm, wherein the single crystal has a full width half mass (FWHM) of less than 50 arcsec.

2. The method of claim 1, wherein the length of the $Ga_2O_3$ based single crystal is greater than 42 mm.

3. The method of claim 1, wherein the length of the $Ga_2O_3$ based single crystal is greater than 52 mm and not greater than 1000 mm.

4. The method of claim 1, wherein the length of the $Ga_2O_3$ based single crystal is greater than 60 mm and not greater than 1000 mm.

5. The method of claim 2, wherein the length of the $Ga_2O_3$ based single crystal is less than 800 mm.

6. The method of claim 1, wherein the $Ga_2O_3$ based single crystal has a width that is greater than 25 mm.

7. The method of claim 1, wherein the $Ga_2O_3$ based single crystal has a width that is greater than 40 mm.

8. The method of claim 1, wherein the $Ga_2O_3$ based single crystal has a width that is greater than 50 mm.

9. The method of claim 6, wherein the width of the $\beta$-$Ga_2O_3$ based single crystal is less than 153 mm.

10. The method of claim 1, wherein the $Ga_2O_3$ based single crystal has a thickness of not less than about 0.2 mm.

11. The method of claim 1, wherein the $Ga_2O_3$ based single crystal has a thickness of not less than about 5 mm.

12. The method of claim 10, wherein the $\beta$-$Ga_2O_3$ based single crystal has a thickness of not greater than 25 mm.

13. The method of claim 1, further comprising adding a dopant to the $Ga_2O_3$ base melt.

14. The method of claim 13, wherein the dopant comprises a material selected from the group consisting of Sc, Sn, In, Zr, Cr, Ce, Mn, Fe, Cu, Ag, Zn, Cd, Al, Si, Mg, Ge, and Nb.

15. The method of claim 14, wherein the crystal has a dopant distribution that is the same at a top of the crystal as a bottom of the crystal.

* * * * *